United States Patent
Sato et al.

(10) Patent No.: US 8,178,857 B2
(45) Date of Patent: May 15, 2012

(54) METHOD AND APPARATUS FOR FLATTENING SOLID SURFACE

(75) Inventors: Akinobu Sato, Tokyo (JP); Akiko Suzuki, Tokyo (JP); Emmanuel Bourelle, Reims (FR); Jiro Matsuo, Kyoto (JP); Toshio Seki, Kyoto (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 326 days.

(21) Appl. No.: 11/920,362

(22) PCT Filed: May 18, 2006

(86) PCT No.: PCT/JP2006/309932
§ 371 (c)(1),
(2), (4) Date: Dec. 21, 2007

(87) PCT Pub. No.: WO2006/123739
PCT Pub. Date: Nov. 23, 2006

(65) Prior Publication Data
US 2008/0315128 A1    Dec. 25, 2008

(30) Foreign Application Priority Data
May 20, 2005  (JP) ................ 2005-148282

(51) Int. Cl.
*G21G 5/00*  (2006.01)
(52) U.S. Cl. ........... 250/492.3; 250/492.1; 250/492.2; 250/492.21; 216/58; 216/72
(58) Field of Classification Search ........... 250/492.1, 250/492.2, 492.21, 492.3, 493.1
See application file for complete search history.

(56) References Cited

U.S. PATENT DOCUMENTS

| | | | |
|---|---|---|---|
| 4,906,594 | A | 3/1990 | Yoneda et al. |
| 5,091,048 | A | 2/1992 | Thomas |
| 5,814,194 | A | 9/1998 | Deguchi et al. |
| 6,331,227 | B1 | 12/2001 | Dykstra et al. |
| 6,375,790 | B1 | 4/2002 | Fenner |
| 6,486,478 | B1 | 11/2002 | Libby et al. |
| 6,624,081 | B2 | 9/2003 | Dykstra et al. |

(Continued)

FOREIGN PATENT DOCUMENTS
EP    1 670 048 A1    6/2006
(Continued)

OTHER PUBLICATIONS

EP Extended Search Report, Nov. 27, 2008, Japan Aviation Electronic.

(Continued)

*Primary Examiner* — Michael Maskell
*Assistant Examiner* — Hanway Chang
(74) *Attorney, Agent, or Firm* — David N. Lathrop

(57) ABSTRACT

A method for flattening a sample surface by irradiating the sample surface with a gas cluster ion beam, generates clusters of source gas in a cluster generating chamber, ionizes the generated clusters in an ionization chamber, accelerates the ionized cluster beam in an electric field of an accelerating electrode, selects a cluster size using a magnetic field of a sorting mechanism, and irradiates the surface of a sample. An irradiation angle between the sample surface and the gas cluster ion beam is less than 30° and an average cluster size of the gas cluster ion beam is 50 or above.

4 Claims, 6 Drawing Sheets

U.S. PATENT DOCUMENTS

| | | | |
|---|---|---|---|
| 6,646,277 | B2 | 11/2003 | Mack et al. |
| 7,064,927 | B2 | 6/2006 | Erickson et al. |
| 7,116,394 | B2 | 10/2006 | Bakker et al. |
| 7,231,705 | B2 | 6/2007 | Kagami et al. |
| 2002/0000552 | A1 | 1/2002 | Morimoto et al. |
| 2002/0001680 | A1 | 1/2002 | Hoehn et al. |
| 2002/0014407 | A1* | 2/2002 | Allen et al. ............... 204/298.36 |
| 2004/0086752 | A1* | 5/2004 | Matsukawa et al. ........... 428/692 |
| 2004/0137158 | A1 | 7/2004 | Kools et al. |
| 2010/0193472 | A1 | 8/2010 | Tabat et al. |

FOREIGN PATENT DOCUMENTS

| | | |
|---|---|---|
| JP | 02-000316 | 1/1990 |
| JP | 07-058089 | 3/1995 |
| JP | 08-120470 | 5/1996 |
| JP | 08-293483 | 11/1996 |
| JP | 2001-284252 | 10/2001 |
| JP | 2003-86865 | 3/2003 |
| JP | 2003-188156 | 7/2003 |
| JP | 2003-208703 | 7/2003 |
| JP | 2004-118954 | 4/2004 |
| JP | 2004-146085 | 5/2004 |
| JP | 2004-253437 | 9/2004 |
| JP | 2006-156065 | 6/2006 |
| WO | WO 01/41181 | 6/2001 |
| WO | WO 01/48794 | 7/2001 |
| WO | WO 03/048407 | 6/2003 |
| WO | WO2005/031838 A1 | 4/2005 |

OTHER PUBLICATIONS

KR First Office Action, Jan. 15, 2009, Japan Aviation Electronic.

Toyoda, N. et al., "Nano structure formation by gas cluster ion beam irradiations at oblique incidence," Nucl. Instr. and Meth. in Phys. Res., B 232, (2005), pp. 212-216.

Bourelle, E. et al., "Sidewall polishing with a gas cluster ion beam for photonic device applications," Nucl. Instr. and Meth. in Phys. Res., B 241, (2005), pp. 622-625.

European examination report for counterpart EP application No. 06 756 347.8-2208.

Kakuta et al., "Low damage smooting of magnetic materials using oblique irradiation of gas cluster ion beam," Materials Research Society Symposium . . . Proceedings, Surface Engineering 2004—Fundamentals and Applications, vol. 843.

Chinese Office Action for counterpart CN application No. 2006800167520.

Toyoda, et al., "Ultra-Smooth Surface Preparation Using Gas Cluster Ion Beams," Jpn. J. Appl. Phys. vol. 41, Jun. 2002, pp. 4287-4290.

Yamada, et al., "Materials processing by gas cluster ion beams," Materials Science and Engineering R34 (2001), pp. 231-295.

Bourelle, et al., "Polishing of Sidewall Surfaces Using a Gas Cluster Ion Beam," Jpn. J. Appl. Phys. vol. 43 No. 10A (2004), pp. L1253-L1255.

First office action issued Sep. 21, 2010 for counterpart Japanese patent application No. 2007-516337.

Garvin et al., "Ion Beam Micromachining of Integrated Optics Components," Applied Optics, Mar. 1973, vol. 12, No. 3, pp. 455-459.

Fang Xu et al., "Fabrication, modeling, and characterization of form-birefringent nanostructures," Optics Letters of Optical Society of America, Dec. 1995, vol. 20, No. 24, pp. 2457-2459.

Cheng et al., "Fabrication of photonic band-gap crystals," J. Vac. Sci. Technol. B, Nov./ Dec. 1995, vol. 13, No. 6, pp. 2696-2700.

Yamada et al., "Materials processing by gas cluster ion beams," Materials Science and Engineering R34 (2001), pp. 231-295.

Kitani et al., "Incident angle dependence of the sputtering effect of Ar-cluster-ion bombardment," Nuclear Instruments and Methods in Physics Research, 1997, pp. 489-492.

Yamada, "Cluster ion beam process technology—20 years of R&D history," Nuclear Instruments and Methods in Physics Research, B257, 2007, pp. 632-638.

Translation of Yamada, "Basic and Applications of Cluster Ion Beams," The Nikkan Kogyo Shinbun. Ltd., p. 25, Oct. 31, 2006, ISBN 9784526057656.

Toyoda et al.; "Ultra-Smooth Surface Preparation Using Gas Cluster Ion Beams," Japanese Journal of Applied Physics, vol. 41 (2002), pp. 4287-4290.

Toyoda et al., "Surface smoothing mechanisim of gas cluster ion beams," Nuclear Instruments and Methods in Physics Research B 161-163 (2000), pp. 980-985.

Office Action issued on Jan. 25, 2011 by the Japanese Patent Office for counterpart foreign patent application JP 2007-516337.

Daub et al., "Ferromagnetic Nanostructures by Atomic Layer Deposition: From Thin Films towards Core-shell Nanotubes", ECS Transactions, 2007, vol. 11, No. 7, pp. 139-148.

"About the ion Milling Process," Ion Beam Milling Inc., 2011, http://www.ionbeammilling.com/ABOUT_THE_ION_MILLING_PROCESS.

Carlow, "The Evolution of Rotating Silicon Surfaces During Ion Bombardment," Scanning Microscopy, 1998, vol. 12, No. 1, pp. 31-41.

Chen, et al., "Smoothing of ZnO Films by Gas Cluster Ion Beam," Nuclear Instruments and Methods in Physics Research 2005, http://danp.sinp.msu.ru/Articles_GSIB/nimb_smoothing_ZNOfilms_GCIB.pdf.

Toyoda et al., "Surface Roughness Reduction Using Gas Cluster Ion Beams for Si Photonics," 5th International Symposium on Advanced Science and Technology of Silicon Materials, Nov. 10-14, 2008, Kona, Hawaii, U.S.A, http://fukuoka.riam.kyushu-u.ac.jp/hawaii2008/pdf/P-02.pdf.

Yamada et al., "Cluster Ion Beam Process Technology," Nuclear Instruments and Method in Physics Research B 206, 2003, pp. 820-829, http://danp.sinp.msu.ru/Articles_GSIB/nimb206_820_Yamada_GCIB_Technology.pdf.

Popok et al., "Beam of Atomic Clusters: Effects on Impact With Solids," Rev. Adv. Mater. Sci. 11, 2006, pp. 19-45, http://www.ipme.ru/e-journals/RAMS/no_11106/popok.pdf.

Popok et al., "New Direction in Nanotechnology: Cluster Ion Beam Technique," 13th International Conference Microwave & Telecommunication Technology, Sep. 8-12, 2003, Sevastopol, Crimea, http://www.fy.chalmers.se/atom/research/publications/2003_Popok_CriMico03_proc.pdf.

McCaffrey et al., "Preparation of Cross-sectional TEM Samples for Low-angle Ion Milling," http://www.ncbi.nlm.nih.gov/pubmed/9140935.

"Ion Milling Parameters for Various Materials Systems," http://www.southbaytech.com/appnotes/35%20Ion%20Milling%20Parameters%20for%20Various%20Materials%20Systems.PDF.

"Improving High Resolution TEM Images using Low Energy Ion Milling," http://www.southbaytech.com/appnotes/68%20Improving%20High%20Resolution%20TEM%20Images%20using%20-Low%20Energy%20Ion%20Milling.pdf, line 7 under the section with the heading "Applications."

Response to office action for U.S. Appl. No. 10/573,942 submitted on Jan. 13, 2012.

* cited by examiner

TABLE A

| SAMPLE NO. | IRRADIATION ANGLE $\theta_p$ (deg.) | AVERAGE CLUSTER SIZE | ACCELERATING VOLTAGE (keV) | SAMPLE TYPE | GAS | Ra (nm) |
|---|---|---|---|---|---|---|
| A1-1 | 5 | 300 | 30 | Si/SiO2 LAMINATE | SF6 | 0.22 |
| A1-2 | 10 | 300 | 30 | Si/SiO2 LAMINATE | SF6 | 0.25 |
| A1-3 | 20 | 300 | 30 | Si/SiO2 LAMINATE | SF6 | 0.24 |
| A1-4 | 25 | 300 | 30 | Si/SiO2 LAMINATE | SF6 | 0.25 |
| A1-5 | 29 | 300 | 30 | Si/SiO2 LAMINATE | SF6 | 0.53 |
| A1-6 | 30 | 300 | 30 | Si/SiO2 LAMINATE | SF6 | 1.29 |
| A1-7 | 35 | 300 | 30 | Si/SiO2 LAMINATE | SF6 | 2.84 |
| A1-8 | 90 | 300 | 30 | Si/SiO2 LAMINATE | SF6 | 3.22 |
| A2-1 | 5 | 300 | 30 | Al2O3-TiC | SF6 | 0.34 |
| A2-2 | 10 | 300 | 30 | Al2O3-TiC | SF6 | 0.32 |
| A2-3 | 20 | 300 | 30 | Al2O3-TiC | SF6 | 0.34 |
| A2-4 | 25 | 300 | 30 | Al2O3-TiC | SF6 | 0.38 |
| A2-5 | 29 | 300 | 30 | Al2O3-TiC | SF6 | 0.78 |
| A2-6 | 30 | 300 | 30 | Al2O3-TiC | SF6 | 2.39 |
| A2-7 | 35 | 300 | 30 | Al2O3-TiC | SF6 | 3.34 |
| A3-1 | 5 | 300 | 30 | poly-Si | SF6 | 0.25 |
| A3-2 | 10 | 300 | 30 | poly-Si | SF6 | 0.23 |
| A3-3 | 20 | 300 | 30 | poly-Si | SF6 | 0.26 |
| A3-4 | 25 | 300 | 30 | poly-Si | SF6 | 0.25 |
| A3-5 | 29 | 300 | 30 | poly-Si | SF6 | 0.43 |
| A3-6 | 30 | 300 | 30 | poly-Si | SF6 | 1.05 |
| A3-7 | 35 | 300 | 30 | poly-Si | SF6 | 2.33 |

FIG. 2A

TABLE B

| SAMPLE NO. | IRRADIATION ANGLE $\theta_p$ (deg.) | AVERAGE CLUSTER SIZE | ACCELERATING VOLTAGE (keV) | SAMPLE TYPE | GAS | Ra (nm) |
|---|---|---|---|---|---|---|
| B1-1 | 10 | 300 | 5 | Si/SiO2 LAMINATE | SF6 | 0.25 |
| B1-2 | 10 | 300 | 10 | Si/SiO2 LAMINATE | SF6 | 0.23 |
| B1-3 | 10 | 300 | 20 | Si/SiO2 LAMINATE | SF6 | 0.24 |
| B1-4 | 10 | 300 | 50 | Si/SiO2 LAMINATE | SF6 | 0.24 |
| B1-5 | 10 | 300 | 70 | Si/SiO2 LAMINATE | SF6 | 0.23 |

FIG. 2B

TABLE C

| SAMPLE NO. | $\theta_p$ (deg.) IRRADIATION ANGLE | AVERAGE CLUSTER SIZE | (keV) ACCELERATING VOLTAGE | SAMPLE TYPE | GAS | Ra (nm) |
|---|---|---|---|---|---|---|
| C1-1 | 10 | 10 | 30 | Si/SiO$_2$ LAMINATE | SF$_6$ | 1.78 |
| C1-2 | 10 | 30 | 30 | Si/SiO$_2$ LAMINATE | SF$_6$ | 1.43 |
| C1-3 | 10 | 40 | 30 | Si/SiO$_2$ LAMINATE | SF$_6$ | 1.07 |
| C1-4 | 10 | 50 | 30 | Si/SiO$_2$ LAMINATE | SF$_6$ | 0.25 |
| C1-5 | 10 | 100 | 30 | Si/SiO$_2$ LAMINATE | SF$_6$ | 0.25 |
| C1-6 | 10 | 500 | 30 | Si/SiO$_2$ LAMINATE | SF$_6$ | 0.24 |
| C1-7 | 10 | 900 | 30 | Si/SiO$_2$ LAMINATE | SF$_6$ | 0.25 |
| C1-8 | 10 | 1000 | 30 | Si/SiO$_2$ LAMINATE | SF$_6$ | 0.11 |
| C1-9 | 10 | 1500 | 30 | Si/SiO$_2$ LAMINATE | SF$_6$ | 0.12 |
| C1-10 | 10 | 3000 | 30 | Si/SiO$_2$ LAMINATE | SF$_6$ | 0.1 |
| C1-11 | 10 | 5000 | 30 | Si/SiO$_2$ LAMINATE | SF$_6$ | 0.09 |
| C1-12 | 10 | 10000 | 30 | Si/SiO$_2$ LAMINATE | SF$_6$ | 0.1 |
| C2-1 | 10 | 10 | 30 | Al$_2$O$_3$-TiC | SF$_6$ | 2.25 |
| C2-2 | 10 | 30 | 30 | Al$_2$O$_3$-TiC | SF$_6$ | 1.79 |
| C2-3 | 10 | 40 | 30 | Al$_2$O$_3$-TiC | SF$_6$ | 1.45 |
| C2-4 | 10 | 50 | 30 | Al$_2$O$_3$-TiC | SF$_6$ | 0.34 |
| C2-5 | 10 | 100 | 30 | Al$_2$O$_3$-TiC | SF$_6$ | 0.32 |
| C2-6 | 10 | 500 | 30 | Al$_2$O$_3$-TiC | SF$_6$ | 0.33 |
| C2-7 | 10 | 900 | 30 | Al$_2$O$_3$-TiC | SF$_6$ | 0.31 |
| C2-8 | 10 | 1000 | 30 | Al$_2$O$_3$-TiC | SF$_6$ | 0.14 |
| C2-9 | 10 | 1500 | 30 | Al$_2$O$_3$-TiC | SF$_6$ | 0.13 |
| C2-10 | 10 | 3000 | 30 | Al$_2$O$_3$-TiC | SF$_6$ | 0.13 |
| C2-11 | 10 | 5000 | 30 | Al$_2$O$_3$-TiC | SF$_6$ | 0.12 |
| C2-12 | 10 | 10000 | 30 | Al$_2$O$_3$-TiC | SF$_6$ | 0.12 |
| C3-1 | 10 | 10 | 30 | poly-Si | SF$_6$ | 2.01 |
| C3-2 | 10 | 30 | 30 | poly-Si | SF$_6$ | 1.52 |
| C3-3 | 10 | 40 | 30 | poly-Si | SF$_6$ | 1.36 |
| C3-4 | 10 | 50 | 30 | poly-Si | SF$_6$ | 0.25 |
| C3-5 | 10 | 100 | 30 | poly-Si | SF$_6$ | 0.23 |
| C3-6 | 10 | 500 | 30 | poly-Si | SF$_6$ | 0.24 |
| C3-7 | 10 | 900 | 30 | poly-Si | SF$_6$ | 0.23 |
| C3-8 | 10 | 1000 | 30 | poly-Si | SF$_6$ | 0.12 |
| C3-9 | 10 | 1500 | 30 | poly-Si | SF$_6$ | 0.12 |
| C3-10 | 10 | 3000 | 30 | poly-Si | SF$_6$ | 0.11 |
| C3-11 | 10 | 5000 | 30 | poly-Si | SF$_6$ | 0.1 |
| C3-12 | 10 | 10000 | 30 | poly-Si | SF$_6$ | 0.1 |

FIG. 3

TABLE D  IRRADIATION ANGLE  ACCELERATING VOLTAGE

| SAMPLE NO. | $\theta_p$ (deg.) | AVERAGE CLUSTER SIZE | (keV) | SAMPLE TYPE | GAS | Ra (nm) |
|---|---|---|---|---|---|---|
| D1-1 | 5 | 300 | 30 | Si/SiO2 LAMINATE | Ar | 0.34 |
| D1-2 | 10 | 300 | 30 | Si/SiO2 LAMINATE | Ar | 0.35 |
| D1-3 | 20 | 300 | 30 | Si/SiO2 LAMINATE | Ar | 0.33 |
| D1-4 | 25 | 300 | 30 | Si/SiO2 LAMINATE | Ar | 0.32 |
| D1-5 | 29 | 300 | 30 | Si/SiO2 LAMINATE | Ar | 0.46 |
| D1-6 | 30 | 300 | 30 | Si/SiO2 LAMINATE | Ar | 1.67 |
| D1-7 | 35 | 300 | 30 | Si/SiO2 LAMINATE | Ar | 3.34 |

FIG. 4A

TABLE E  IRRADIATION ANGLE  ACCELERATING VOLTAGE

| SAMPLE NO. | $\theta_p$ (deg.) | AVERAGE CLUSTER SIZE | (keV) | SAMPLE TYPE | GAS | Ra (nm) |
|---|---|---|---|---|---|---|
| E1-1 | 10 | 10 | 30 | Si/SiO2 LAMINATE | Ar | 2.25 |
| E1-2 | 10 | 30 | 30 | Si/SiO2 LAMINATE | Ar | 2.13 |
| E1-3 | 10 | 40 | 30 | Si/SiO2 LAMINATE | Ar | 1.86 |
| E1-4 | 10 | 50 | 30 | Si/SiO2 LAMINATE | Ar | 0.39 |
| E1-5 | 10 | 100 | 30 | Si/SiO2 LAMINATE | Ar | 0.35 |
| E1-6 | 10 | 500 | 30 | Si/SiO2 LAMINATE | Ar | 0.34 |
| E1-7 | 10 | 900 | 30 | Si/SiO2 LAMINATE | Ar | 0.33 |
| E1-8 | 10 | 1000 | 30 | Si/SiO2 LAMINATE | Ar | 0.13 |
| E1-9 | 10 | 1500 | 30 | Si/SiO2 LAMINATE | Ar | 0.17 |
| E1-10 | 10 | 3000 | 30 | Si/SiO2 LAMINATE | Ar | 0.13 |
| E1-11 | 10 | 5000 | 30 | Si/SiO2 LAMINATE | Ar | 0.15 |
| E1-12 | 10 | 10000 | 30 | Si/SiO2 LAMINATE | Ar | 0.17 |

FIG. 4B

METHOD AND APPARATUS FOR FLATTENING SOLID SURFACE

TECHNICAL FIELD

The present invention relates to a method and apparatus for flattening solid surfaces by gas cluster ion beam irradiation and is applicable, for example, to flattening of surfaces of semiconductors and other electronic device materials as well as to flattening of various device surfaces and pattern surfaces.

BACKGROUND ART

Various gas phase reaction processes have been developed and put to practical use for surface flattening and the like of electronic devices. For example, a substrate surface flattening method described in patent literature 1 flattens substrate surfaces by irradiating them with monatomic ions of Ar (argon) gas or the like or molecular ions at a low irradiation angle to cause sputtering.

Recently, a method for flattening solid surfaces using a gas cluster ion beam has been drawing attention because of reduced surface damage and capability to reduce surface roughness greatly. For example, patent literature 2 discloses a method for reducing surface roughness by irradiating solid surfaces with a gas cluster ion beam.

In this method, gas cluster ions directed at a workpiece are broken by collisions with the workpiece, causing multi-body collisions between constituent atoms or molecules of the clusters and constituent atoms or molecules of the workpiece, consequently causing conspicuous motion parallel to a workpiece surface, and thus producing a cut in a direction parallel (hereinafter referred to as a lateral direction) to the workpiece surface. This phenomenon is known as lateral sputtering. The lateral motion of particles with respect to the workpiece surface enables ultra-precision flat grinding corresponding to the size of atoms.

A gas cluster ion beam, whose ion energy per atom is lower than in ion etching, enables required ultra-precision grinding without damaging the workpiece surface. This indicates the advantage that solid surface flattening by means of a gas cluster ion beam causes less damage to workpiece surface than ion etching described in patent literature 1.

In the flattening by means of a gas cluster ion beam, it is generally recognized that preferably the cluster ion beam is directed approximately perpendicular to the workpiece surface. This is to make full use of the effect of "surface flattening by means of lateral sputtering." However, although patent literature 2 described above states that the gas cluster ion beam may be directed obliquely depending on surface conditions such as curves, it does not mention any effect of directing the gas cluster ion beam obliquely. Thus, according to patent literature 2, it follows that the most efficient way to flatten a solid surface is to direct the beam approximately perpendicularly to the surface.

An example of solid surface flattening by means of a gas cluster ion beam is also disclosed in patent literature 3. Patent literature 3 does not state the effect of an angle between the gas cluster ion beam and solid surface on surface flattening, either. In view of the use of "lateral sputtering" effect, it appears that patent literature 3 shows data on vertical irradiation as in the case of patent literature 2 described earlier.

Solid surface flattening by means of gas cluster ion beam irradiation is also reported by non-patent literature 1. Toyoda, et al. irradiated surfaces of materials such as Ge, SiC, and GaN with Ar cluster ions and showed that surface roughness is reduced by the irradiation. Again, the gas cluster ion beam was directed approximately perpendicularly to the surfaces.

On the other hand, non-patent literature 2 describes changes in the roughness of a solid surface when the solid surface is irradiated with a gas cluster ion beam at various irradiation angles. Between vertical incidence on the surface at 90° and irradiation parallel to the surface at 0°, it shows that an etching rate, i.e., speed at which the surface is etched, is the largest at the time of vertical incidence and decreases with decreases in the irradiation angle. Regarding relationship between the surface roughness and irradiation angle, by conducting experiments using irradiation angles 90°, 75°, 60°, 45°, and 30°, it shows that the surface roughness increases with decreases in the irradiation angle. Irradiation angles below 30° were not checked experimentally maybe because it was considered meaningless.

Integrated circuits and other electronic devices as well as optical devices used for optical communications often contain concavo-convex patterns produced by microfabrication on solid surfaces or surfaces of thin-film materials. However, there has been no report on the use of a gas cluster ion beam for flattening of lateral wall surfaces in concave or convex portions of the concavo-convex patterns. This is because it is considered to be difficult to direct a gas cluster ion beam approximately perpendicularly to lateral wall surfaces in concave or convex portions and impossible to flatten the lateral wall surfaces by the mechanism of lateral sputtering.

Recently, it has been found that irradiation angles smaller than 30° reduce surface roughness greatly (non-patent literature 3). This utilizes effect of oblique irradiation different from the conventional flattening mechanism by means of lateral sputtering.

Patent literature 1: Japanese Patent Application Laid Open No. H07-058089
Patent literature 2: Japanese Patent Application Laid Open No. H08-120470
Patent literature 3: Japanese Patent Application Laid Open No. H08-293483
Non-patent literature 1: Jpn. J. Appl. Phys. Vol. 41 (2002), pp. 4287-4290
Non-patent literature 2: Materials Science and Engineering R34 (2001), pp. 231-295
Non-patent literature 3: Jpn. J. Appl. Phys. Vol. 43, 10A (2004), pp. L1253-L1255

DISCLOSURE OF THE INVENTION

Problems to be Solved by the Invention

The flattening method by means of sputtering with Ar gas or the like disclosed in patent literature 1 flattens a substrate surface to some extent by grinding convex portions on the substrate surface preferentially, but it must keep irradiation energy below about 100 eV in order to prevent damage to the substrate surface. This has a problem in that ion current is reduced extremely, making it impossible to obtain a practical sputtering rate. Also, when flattening a composite material which is a combination of different materials, there is a limit to flattening because the etching rate varies with the type of material.

Regarding the methods for surface flattening by means of "approximately perpendicular lateral sputtering" through irradiation of solid surfaces with a gas cluster ion beam, such as those described in patent literatures 2 and 3 and non-patent literatures 1 and 2, although they reduce surface roughness to some extent, they cannot meet the demand to further reduce surface roughness because they cannot completely remove crater-like deformation formed on the solid surfaces during collisions of cluster ions. When flattening a composite material which is a combination of different materials, again the problem is that there is a limit to flattening because the etching rate varies with the type of material.

The method described in non-patent literature 3 which uses irradiation angles smaller than 30° with respect to solid surfaces does not pay attention to controlling the cluster size of the gas cluster ion beam, and it turned out that there was a limit to flattening when flattening a composite material which is a combination of different materials.

An object of the present invention is to solve the above problems and provide a surface flattening method and apparatus which cause less damage to solid surfaces of composite materials or polycrystals which have different etching rates within the same surface and can reduce their surface roughness more than conventional methods can.

Means to Solve Problems

According to the present invention, a method for flattening a surface of a solid which has different etching rates within the same surface by irradiating the surface of the solid with a gas cluster ion beam includes:

a step of irradiating the surface of the solid with the gas cluster ion beam with an average cluster size of 50 or larger at an irradiation angle smaller than 30° between the surface of the solid and the gas cluster ion beam.

According to the present invention, a solid surface flattening apparatus which flattens a surface of a solid sample through irradiation with a gas cluster ion beam includes:

means for generating the gas cluster ion beam;
cluster size sorting means for selecting a cluster size equal to or larger than 50 for the gas cluster ion beam;
sample supporting means for supporting the solid sample in such a way as to be able to vary an incident angle of the gas cluster ion beam whose cluster size has been selected; and
irradiation angle setting means capable of setting an irradiation angle between the surface of the solid sample and the gas cluster ion beam to less than 30°.

Effects of the Invention

The present invention can reduce surface roughness and surface damage more than conventional methods can.

BRIEF DESCRIPTION OF THE DRAWINGS

FIG. 2A is a table showing measurement results of a relationship between irradiation angle and surface roughness of samples;

FIG. 2B is a table showing measurement results of surface roughness when beam accelerating voltage of a Si/SiO₂ multilayer film is varied;

FIG. 3 is a table showing measurement results of a relationship between cluster size of a gas cluster ion beam and surface roughness of samples;

FIG. 4A is a table showing measurement results of a relationship between irradiation angle and surface roughness of samples when the type of gas used is argon;

FIG. 4B is a table showing measurement results of a relationship between cluster size and surface roughness when the type of gas used is argon;

BEST MODE FOR CARRYING OUT THE INVENTION

Figure 1:
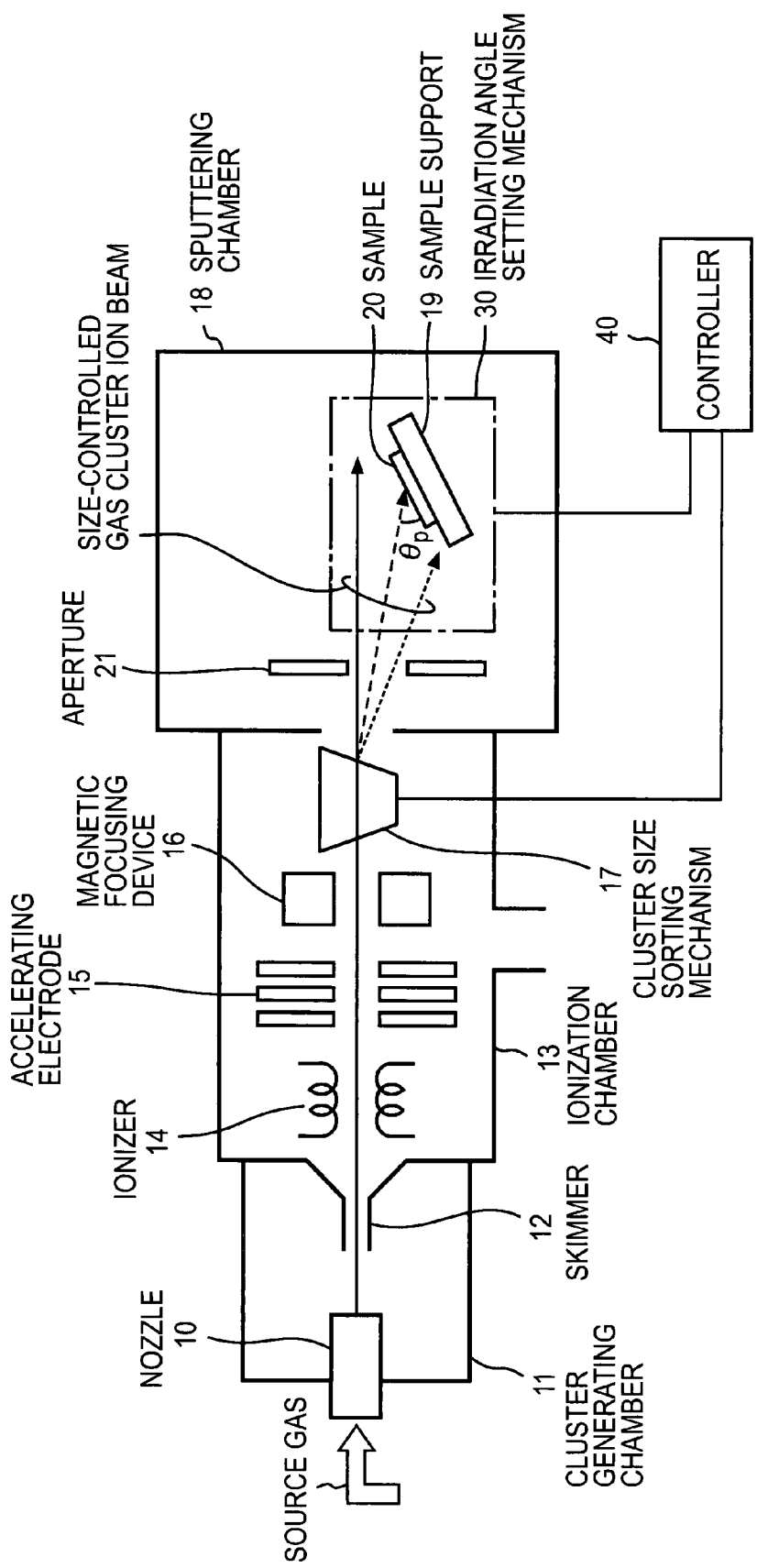
FIG. 1 is a diagram showing a basic configuration of a solid surface processing apparatus which implements a solid surface flattening method according to the present invention.

An embodiment of the present invention will be described below with reference to examples. To begin with, a basic configuration of a gas cluster ion beam flattening apparatus which implements a solid surface flattening method according to the present invention will be described below with reference to FIG. 1.

A source gas is injected into a cluster generating chamber 11 through a nozzle 10 and gas molecules are condensed to generate clusters. The clusters are introduced as a cluster beam into an ionization chamber 13 through a skimmer 12. In the ionization chamber 13, neutral clusters are ionized by electron rays such as thermoelectrons emitted from an ionizer 14. The ionized cluster beam is accelerated by an accelerating electrode 15, focused by a magnetic focusing device 16, and introduced into a strong magnetic deflection type cluster size sorting mechanism 17 which uses a permanent magnet. Since cluster ions vary in a deflection angle depending on their size (number of atoms or molecules), it is possible to select a cluster ion beam of desired size by selecting cluster ions of a desired deflection angle.

The cluster ion beam whose cluster size is sorted and controlled enters a sputtering chamber 18. A sample 20 is mounted on a sample support 19 of an irradiation angle setting mechanism 30 installed in the sputtering chamber 18 and the incident cluster ion beam set to a predetermined beam diameter through an aperture 21 is directed at a surface of the sample 20. The irradiation angle setting mechanism 30 is controlled by a controller 40 so that the sample surface will form a desired irradiation angle $\theta_p$ with the cluster ion beam. Incidentally, if the sample 20 to be flattened is an electrical insulator, the cluster ions may be neutralized by electrons in advance.

The following experiments were conducted using, for example, Si/SiO₂ multilayer laminate films as the composite material whose surface was flattened according to the present invention and using, for example, an Al₂O₃—TiC sintered bodies and polycrystalline silicon films as materials which have different etching rates within the same surface.

EXPERIMENT A

An SF₆ cluster ion beam was generated using a mixture of SF₆ gas and He gas as a source gas, and SF₆ cluster ions accelerated to 5 to 70 keV were directed at surfaces of samples 20 at various irradiation angles $\theta_p$. An irradiation dose was $4 \times 10^{15}$ ions/cm². After the irradiation, the roughness of the sample surfaces was measured under an atomic force microscope (AFM). Measurement results are shown in Table A in FIG. 2A.

As the samples 20, the following samples were used: samples A1-1 to A1-8 of an alternately laminated multilayer film (50 layers) consisting of silicon (Si) films (100 nm thick) and silicon dioxide (SiO₂) films (100 nm thick) formed on a silicon substrate by sputtering, samples A2-1 to A2-7 of Al₂O₃—TiC sintered bodies, samples A3-1 to A3-7 of a polycrystalline silicon film (represented by poly-Si) obtained by forming an amorphous silicon film on a silicon substrate by sputtering and crystallizing it by heat annealing.

To evaluate flattening of a material layer with different etching rates, a silicon substrate on which an Si/SiO$_2$ multilayer film was formed was cleaved to reveal a cross section of the multilayer film and the cross section of the multilayer film was irradiated with a gas cluster ion beam. The average surface roughness (Ra) of the composite materials before the flattening process was 2.19 nm in the case of the Si/SiO$_2$ multilayer film, and 3.78 nm in the case of the Al$_2$O$_3$—TiC sintered bodies. The average surface roughness (Ra) of the polycrystalline silicon film was 2.95 nm.

Regarding the polycrystalline silicon film, to measure the degree of damage on the surfaces after the flattening process, a profile of S which had penetrated into a surface layer of polycrystalline silicon film sample A3-4 at an irradiation angle of 25° was evaluated by secondary ion mass spectrometry (SIMS). It was found that S had penetrated only about 10 nm from the surface. On the other hand, in polycrystalline silicon film samples A3-6 and A3-7 at an irradiation angle of 30° or above, penetration was observed to a depth of 40 to 50 nm from the surface.

EXPERIMENT B

Samples B1-1 to B1-5 consisting of a Si/SiO$_2$ multilayer film were irradiated with a gas cluster ion beam by varying accelerating voltage with the irradiation angle $\theta_p$ fixed at 10°. The other conditions were the same as experiment A above. Results are shown in Table B in FIG. 2B.

EXPERIMENT C

Samples C1-1 to C1-12 of a Si/SiO$_2$ multilayer film, samples C2-1 to C2-12 of Al$_2$O$_3$—TiC sintered bodies, and samples C3-1 to C3-12 of a polycrystalline silicon film were irradiated with a gas cluster ion beam by varying the average cluster size with the irradiation angle $\theta_p$ fixed at 10°. The other conditions were the same as experiment A above. Results are shown in Table C in FIG. 3.

EXPERIMENT D

An Ar cluster ion beam was generated using Ar gas as a source gas. Ar cluster ion beam accelerated to 30 keV were directed at cross sections of samples D1-1 to D1-7 of a Si/SiO$_2$ multilayer film at various irradiation angles $\theta_p$. Results are shown in Table D in FIG. 4A. The irradiation dose was 1×10$^{16}$ ions/cm$^2$. After the irradiation, the roughness of the sample surfaces was measured under an atomic force microscope (AFM). The other conditions were the same as experiment A.

EXPERIMENT E

Cross sections of samples E1-1 to E1-12 of a Si/SiO$_2$ multilayer film were irradiated with an Ar cluster ion beam by varying the cluster size with the irradiation angle $\theta_p$ fixed at 10°. The other conditions were the same as experiment D. Results are shown in Table E in FIG. 4B.

EXPERIMENT F

Cross sections of samples F1-1 to F1-6 of a Si/SiO$_2$ multilayer films of different thicknesses were irradiated with a gas cluster ion beam by varying the irradiation angle $\theta_p$. In so doing, the thicknesses of layer films were varied from 10 nm to 5 μm with the film thicknesses of Si and SiO$_2$ kept equal. After the irradiation, the roughness of the sample surfaces was measured under an atomic force microscope (AFM). The other conditions were the same as experiment A. Results are shown FIG. 5. Incidentally, the average surface roughness (Ra) of the cross sections of the Si/SiO$_2$ multilayer samples before the flattening process was in the range of 2 to 3 nm.

EXPERIMENT G

Resist was applied to a silicon substrate on which a 200-nm thick silicon dioxide film had been formed by thermal oxidation, a line-and-space pattern was drawn using an electron beam exposure system, and a mask pattern was formed by development. Line width was 1 μm and space width was 4 μm. The silicon dioxide film and silicon substrate were etched using an ion milling system. Total etch depth of the silicon dioxide film and silicon substrate was 500 nm. After a concavo-convex pattern was formed in this way, lateral wall surfaces in concave portions of Si/SiO$_2$ material were flattened and evaluated in the same manner as experiments A, B, and C by regarding the Si/SiO$_2$ material, which is a combination of different types of materials, as a composite material. The surface roughness of the lateral walls in concave portions were measured and results were almost the same as examples A, B, and C. Incidentally, the average surface roughness (Ra) of the lateral wall surfaces before the flattening process was in 3.52 nm.

Discussion

As shown in Tables A, C, D, and E by separating by broken lines, it can be seen that the surface roughness of composite material and polycrystals can be reduced greatly when the irradiation angle $\theta_p$ of a gas cluster ion beam is below 30° and the cluster size is 50 or above. This effect was not anticipated conventionally. That is, the solid surface flattening method according to the present invention is characterized in that the irradiation angle of a gas cluster ion beam is below 30° and that the cluster size is 50 or above. The irradiation conditions for samples A1-1 to A1-5, A2-1 to A2-5, and A3-1 to A3-5 in Table A; samples B1-1 to B1-5 in Table B; samples C1-4 to C1-12, C2-4 to C2-12, and C3-4 to C3-12 in Table C; samples D1-1 to D1-5 in Table D; samples E1-4 to E1-12 in Table E; and the like are all included in the flattening method according to the present invention.

Furthermore, it can be seen that more marked flattening effect is produced when the cluster size is 1000 or above. On the other hand, the irradiation conditions for sample A1-8 in Table A are the same as the conventional example in which a gas cluster ion beam is incident perpendicularly on the sample surface. Although conventional study results indicate that surface roughness can be reduced greatly, it can be seen that surfaces of composite materials can hardly be flattened.

Principles of the flattening effect can be interpreted as follows. When applied, for example, to a composite material, which varies in the etching rate among different types of material, conventional flattening methods which use normal incidence on material surfaces produce steps. Thus, they cannot flatten the material or have limits. This is because conventional lateral sputtering is effective in a range of only a few nanometers, and etching rate differences among materials become prominent in a wider range (larger than a few nanometers).

On the other hand, conventional methods which use irradiation angles smaller than 30° do not take cluster size into consideration. It has been found that at irradiation angles smaller than 30°, interaction with the material surface occurs in such a way as to leave a very long trail in the traveling direction of clusters. The present invention showed for the first time that to take effective use of this phenomenon, it is important to control the cluster size. It demonstrated experimentally that marked effect is produced when the cluster size is 50 or above and that very marked effect is produced when the cluster size is 1000 or above. Qualitatively, it is believed that there is a mechanism whereby increases in the cluster size cause very large interaction in the irradiation direction, resulting in marked increases in the flattening effect around cluster sizes of 50 and 1000.

Also, from Table C, it can be seen that the flattening effect on composite material when the cluster size is varied does not depend on the type of composite material. This is because, as described above, the flattening is caused by a phenomenon in which gas clusters recoil from collisions with a material surface, grinding and etching tips of protrusions on any material. It further appears from the experimental results that the flattening effect of the present invention on composite material intrinsically does not have material dependence. That is, the effect of the present invention works similarly regardless of whether particles of different materials are dispersed in a mixture, particles of the same composition which differ in crystal orientation and crystallinity (the degree of amorphousness) are dispersed, or different types of materials are distributed as in the case of a multilayer film structure.

Also, from Table B, it can be seen that the effect does not depend on the accelerating voltage of gas cluster ions. In view of the above mechanism, this indicates that the accelerating voltage of gas cluster ions greatly affects flattening speed, but does not depend much on the phenomenon in which gas clusters recoil from collisions with a material surface. That is, it appears that the accelerating voltage greatly affects kinetic energy and velocity of the gas cluster ions, but does not affect angles of recoil from collisions.

From tables A, C, D, and E, it can be seen that the solid surface flattening effect of the present invention is similarly achieved by both chemically reactive $SF_6$ gas clusters and chemically nonreactive Ar without depending on the type of gas cluster.

Figure 5:
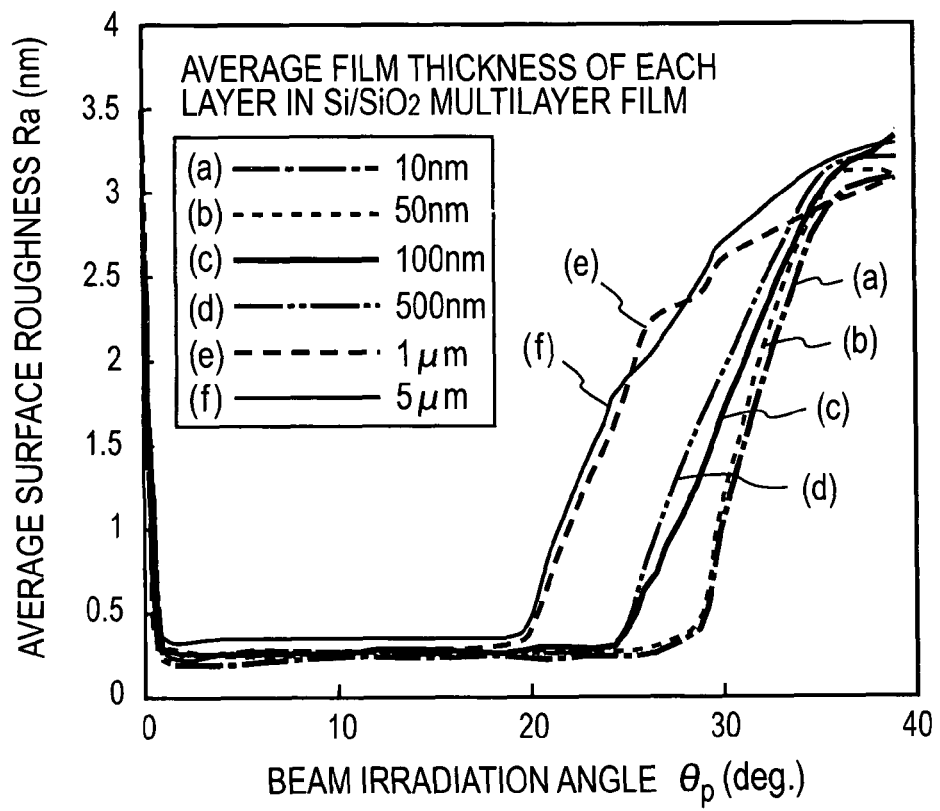
FIG. 5 is a graph showing measurement results of surface roughness vs. irradiation angle.

From FIG. 5 which shows measurement results of experiment F, it can be seen that the irradiation angle $\theta_p$ at which marked flattening effect is produced changes with changes in a cycle of different materials (film thickness, grain size, etc. of each layer in a multilayer film). The larger the cycle of different materials, the smaller the irradiation angle $\theta_p$ of the gas cluster ion beam tends to be. This is an easy-to-understand phenomenon in view of the flattening mechanism according to the present invention described above.

However, as shown in FIG. 5, it was experimentally shown that there is no simple relationship between the cycle of different materials and the irradiation angle $\theta_p$ at which the effect works and that the effect works suddenly at irradiation angles $\theta_p$ of 30°, 25°, and 20°. That is, the surface roughness can be reduced greatly if the irradiation angle $\theta_p$ is decreased to 25° or less when the composite material consists of a combination of different particles and the average grain size of the different particles or average crystal grain size is less than 1 µm, but not less than 100 nm or when the composite material has a multilayer film structure and the average film thickness of the layers is less than 1 µm, but not less than 100 nm. When the average grain size, average crystal grain size, or the average film thickness is 1 µm or above, the surface roughness can be reduced greatly if the irradiation angle $\theta_p$ is decreased to 20° or less. Although details of this mechanism is not clear, it is presumed that high density state which exists when gas clusters collide with the composite material or polycrystal surfaces is involved here.

From experiment G, it can be seen that the flattening effect of the present invention on different materials is also applicable to lateral wall surfaces of micropatterns. Also, it can be seen that when there are simply two types of material, the present invention can be applied to them by regarding them as a composite material. This is an essential of the present invention. That is, it appears appropriate to state that the flattening effect of the present invention on composite material works if there are at least two different types of material. In order for the different types of material to coexist, it is sufficient if they simply exist in two locations. Thus, when there are simply two types of material as in the case of experiment G flattening cannot be achieved by conventional methods, and it is only by the present invention that marked flattening can be achieved.

When the degree of damage on the material surfaces after the flattening process in experiment A is compared with results obtained by a conventional method, whereas with the conventional method, S penetrates 40 to 50 nm from the surface, causing damage, the present invention causes damage only to a depth of 10 nm or less. Thus, it can be seen that the present invention can flatten solid surfaces with minimal damage.

Figure 6A:
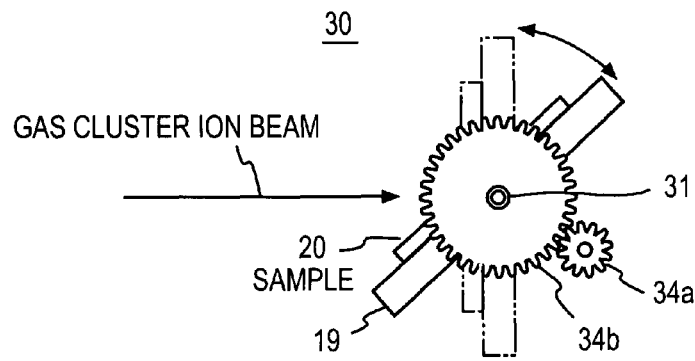
FIG. 6A is a side view showing an example of an irradiation angle setting mechanism.
Figure 6B:
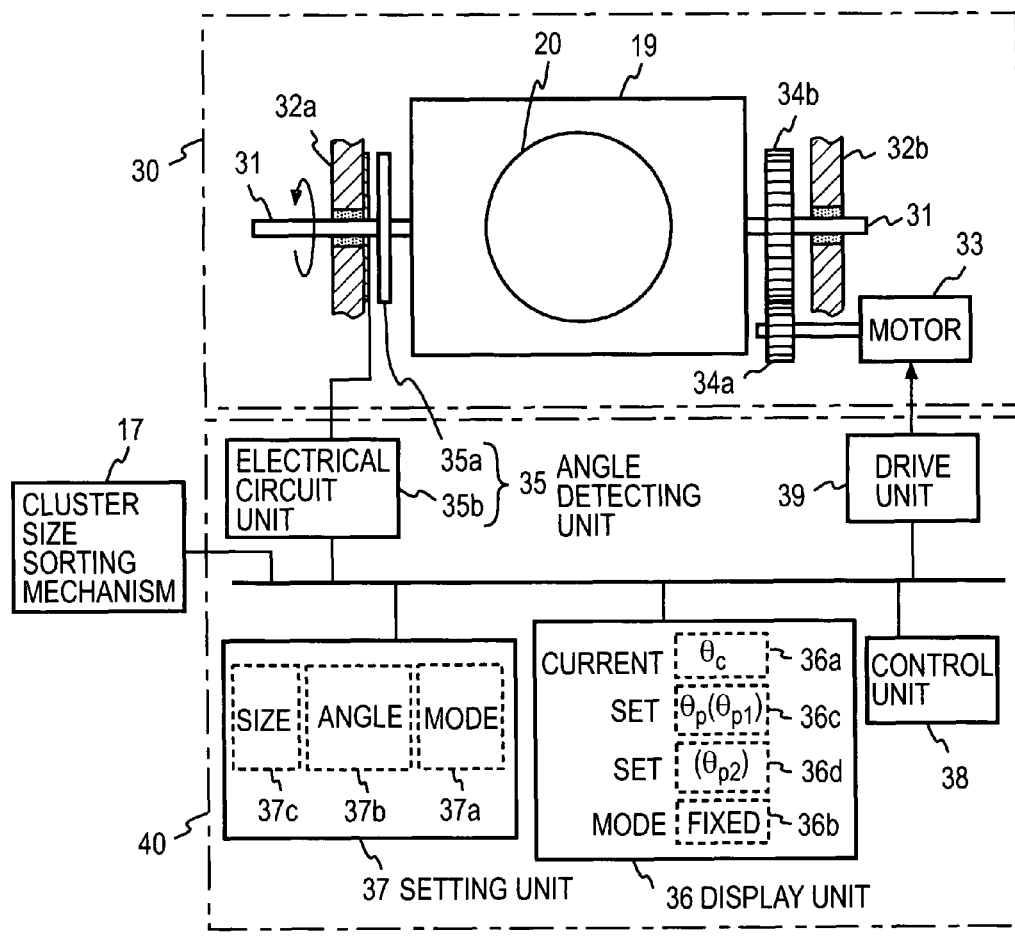
FIG. 6B is a diagram showing a plan view of the irradiation angle setting mechanism and a configuration example of a controller.

According to the present invention, when using irradiation angles $\theta_p$ smaller than 30°, various modes are conceivable, including not only a mode which involves a fixed value, but also a mode which involves two stages and mode which involves repetition of continuous changes. The solid surface processing apparatus (flattening apparatus) according to the present invention shown in FIG. 1 allows mode and irradiation angle $\theta_p$ settings. The sample support 19 is mounted on a rotating shaft 31 supported by stationary plates 32a and 32b as can be seen, for example, from FIG. 6A which shows a side face of the irradiation angle setting mechanism 30 and FIG. 6B which shows the front face of the irradiation angle setting mechanism 30 and the controller 40. An encoder plate 35a of an angle detecting unit 35 is mounted between the rotating shaft 31 and stationary plate 32a to detect a rotation angle of the sample support 19, i.e., the irradiation angle $\theta_p$ of the gas cluster ion beam with respect to the to-be-flattened surface of the sample 20 mounted on the sample support 19, as a digital value. The controller 40 consists of an electrical circuit unit 35b, display unit 36, setting unit 37, control unit 38, and drive unit 39. A detected angle (irradiation angle) $\theta_c$ from the electrical circuit unit 35b of the angle detecting unit 35 is displayed in a current angle area 36a of the display unit 36.

When a user sets a Fixed mode by manipulating a mode setting unit 37a of the setting unit 37 and enters a desired irradiation angle $\theta_p$ by manipulating an angle setting unit 37b, "Fixed" is displayed in a mode area 36b of the display unit 36, the set angle is displayed in a set angle area 36c, and the control unit 38 drives a motor 33 via the drive unit 39 so that the current angle $\theta_c$ will coincide with the set angle $\theta_p$.

When the user sets a Two Stage mode and enters $\theta_{p1}$ and $\theta_{p2}$ in sequence as irradiation angles, "Two Stage" is displayed in the mode area, the first set angle $\theta_{p1}$ is displayed in the set angle area 36c and the second set angle $\theta_{p2}$ is displayed in a set angle area 36d, and in a first stage process, the control unit 38 drives and controls the motor 33 so that the current angle $\theta_c$ in the set angle area 36c will coincide with the set angle $\theta_{p1}$. In a second stage process, the motor 33 is driven and controlled such that the current angle $\theta_c$ in the set angle area 36d will coincide with the set angle $\theta_{p2}$.

When a user sets a Continuous Change mode and enters $\theta_{p1}$ and $\theta_{p2}$ in sequence as angles, "Continuous Change" is displayed in the mode area, the set angles $\theta_{p1}$ and $\theta_{p2}$ are displayed in the set angle areas 36c and 36d, respectively, and the control unit 38 controls the motor 33 so that the irradiation angle $\theta_p$ will change continuously, reciprocating between the two set angles $\theta_{p1}$ and $\theta_{p2}$.

Incidentally, a size setting unit 37c of the setting unit 37 is used to input and set the cluster size of the gas cluster ion beam. The control unit 38 drives and controls the cluster size sorting mechanism 17 based on the input.

The control unit 38 is a CPU (central processing unit) or microprocessor which causes the various types of display and driving of the motor 33 and the like to be performed based on a setting program. The setting unit 37 is an input means such as a keyboard.

In the example described above, the strong magnetic deflection type cluster size sorting mechanism 17 based on a permanent magnet is used to control the cluster size. The cluster size is controlled using an angle at which clusters are emitted from the cluster size sorting mechanism 17. It is alternatively possible to clarify a relationship between the cluster size and emission angle in advance and provide a display area for the cluster size.

Incidentally, the cluster size may be adjusted by limiting the size of clusters when they are generated in the cluster generating chamber 11 instead of using such a cluster size sorting mechanism 17.

What is claimed is:

1. A method for flattening a surface of a solid by irradiating the surface of the solid with a gas cluster ion beam, comprising:
    a step of supporting a solid composed of different materials of different etching rates and having a surface to be flattened including areas of the different etching rates of the different materials;
    a step of generating a gas cluster ion beam with an average cluster size of 50 or larger; and
    a step of irradiating the surface of the solid including the areas of the different etching rates with the gas cluster ion beam at an irradiation angle smaller than 30° between the surface of the solid and the gas cluster ion beam.

2. The solid surface flattening method according to claim 1, wherein the solid is a composite of particles of the different materials with an average grain size being less than 1 μm, but not less than 100 nm or a multilayer film of plural layers of the different materials with an average film thickness of each layer being less than 1 μm, but not less than 100 nm; and the irradiation angle is 25° or less.

3. The solid surface flattening method according to claim 1, wherein the solid is a composite of different types of particle forming the different materials with an average grain size being equal to or larger than 1 μm or a multilayer film of plural layers forming the different materials with an average film thickness of each layer being equal to or larger than 1 μm; and the irradiation angle is 20° or less.

4. A solid surface flattening apparatus which flattens a surface of a solid sample through irradiation with a gas cluster ion beam, comprising:
    means for generating the gas cluster ion beam;
    cluster size sorting means for selecting a cluster size equal to or larger than 50 for the gas cluster ion beam;
    sample supporting means for supporting a solid composed of different materials of different etching rates and having a surface including areas of the different etching rates of the different materials in such a way as to be able to vary an incident angle of the gas cluster ion beam whose cluster size has been selected;
    irradiation angle setting means for setting an irradiation angle between the surface of the solid sample and the gas cluster ion beam to less than 30°; and
    means for irradiating the surface of the solid including the areas of the different etching rates with the gas cluster ion beam at an irradiation angle set less than 30° by the irradiation angle setting means.

\* \* \* \* \*